(12) United States Patent
Slaboda

(10) Patent No.: US 7,587,015 B2
(45) Date of Patent: Sep. 8, 2009

(54) ASYNCHRONOUS DIGITAL DATA CAPTURE

(75) Inventor: Kevin Slaboda, Burlingame, CA (US)

(73) Assignee: Verigy (Singapore) Pte. Ltd., Singapore (SG)

(*) Notice: Subject to any disclaimer, the term of this patent is extended or adjusted under 35 U.S.C. 154(b) by 581 days.

(21) Appl. No.: 11/355,599

(22) Filed: Feb. 15, 2006

(65) Prior Publication Data
US 2007/0189372 A1   Aug. 16, 2007

(51) Int. Cl.
*H04L 7/00* (2006.01)
(52) U.S. Cl. .................. 375/355; 375/359; 375/225; 375/376; 375/371; 375/226; 702/67; 702/69; 702/75; 702/76
(58) Field of Classification Search .......... 375/359, 375/355, 225, 376, 224, 371, 373, 226; 702/66, 702/67, 69, 72, 76
See application file for complete search history.

(56) References Cited

U.S. PATENT DOCUMENTS

| | | | | |
|---|---|---|---|---|
| 5,446,765 A | * | 8/1995 | Leger | 375/359 |
| 6,985,552 B1 | * | 1/2006 | King | 375/376 |
| 7,148,828 B2 | * | 12/2006 | Fernandez et al. | 341/120 |
| 7,339,984 B1 | * | 3/2008 | Daou | 375/225 |
| 7,356,077 B2 | * | 4/2008 | Fala et al. | 375/224 |
| 2004/0114698 A1 | * | 6/2004 | Barrett et al. | 375/355 |

* cited by examiner

*Primary Examiner*—Phuong Phu
(74) *Attorney, Agent, or Firm*—Holland & Hart, LLP

(57) ABSTRACT

The present invention provides asynchronous digital capture by first, capturing the digital output of the device under test (DUT) clock on an automated test equipment (ATE) digital channel. Next, the NRZ output data of the DUT is captured while the clock signal is captured on adjacent ATE channels. Next, the digital clock data is analyzed such that a frequency spectrum is generated. From the spectrum, the frequency and phase of the clock is calculated. From the clock frequency, the number of device cycles captured is determined. From the phase of the clock, the captured data is aligned with the clock data to determine which device cycles have been oversampled.

5 Claims, 1 Drawing Sheet

ASYNCHRONOUS DIGITAL DATA CAPTURE

BACKGROUND

Asynchronous digital data capture is currently done by using specific load board hardware or special hardware within a test system. The data is clocked in first in first out (FIFO) by a Device Under Test (DUT). Then, the data is clocked out of the FIFO into the test system by a clock synchronous with the test system.

Unfortunately, the specific load board hardware adds design cost, design time, and maintenance. In addition, this extends the time to market for a solution.

SUMMARY

The present invention provides asynchronous digital capture by first, capturing the digital output of the device under test (DUT) clock on an automated test equipment (ATE) digital channel. Next, the NRZ output data of the DUT is captured while the clock signal is captured on adjacent ATE channels. Next, the digital clock data is analyzed such that a frequency spectrum is generated. From the spectrum, the frequency and phase of the clock is calculated. From the clock frequency, the number of device cycles captured is determined. From the phase of the clock, the captured data is aligned with the clock data to determine which device cycles have been oversampled.

Further features and advantages of the present invention, as well as the structure and operation of preferred embodiments of the present invention, are described in detail below with reference to the accompanying exemplary drawings.

DETAILED DESCRIPTION

The present invention eliminates the need for specialized design, implementation, and maintenance of specialized hardware. This results in reduced time to market and cost for an automated production test solution.

Functionally, the DUT clock output is synchronized to the DUT data output by applying digital signal processing (DSP) techniques to he data and clock rate so that the solution is implemented with default or standard test system features and software. This simplifies application hardware and load board design enablement.

Figure 1:
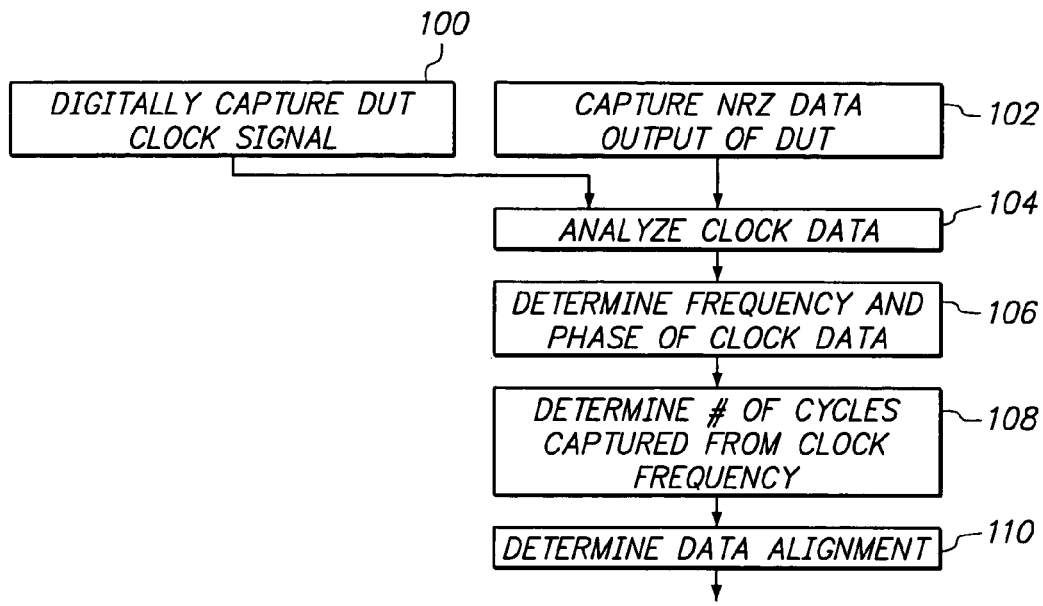
FIG. 1 describes a process flowchart according to the present invention.

FIG. 1 describes a process flowchart according to the present invention.

In step 100, the digital output of the DUT clock is captured on an automated test equipment (ATE) digital channel.

In step 102, the (non return to zero) NRZ output data of the DUT is captured while the clock signal is captured on adjacent ATE channels.

Steps 100 and 102 occur concurrently.

Figure 2:
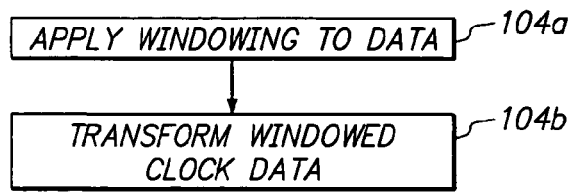
FIG. 2 describes a process flowchart according to the present invention for analyzing digital clock data.

In step 104, the digital clock data is analyzed. As shown in FIG. 2, in step 104a, the data stream is multiplied by a DSP window, e.g. Hanning or Hamming. In step 104b, a fast Fourier transform (FFT) may be done on the windowed clock data and the resulting spectrum is analyzed. Alternatively, a discrete Fourier transform may be applied to the windowed clock data.

Referring back to FIG. 1, in step 106, the frequency and phase of the clock is calculated from the FFT spectrum.

In step 108, the number of device cycles captured is determined from the clock frequency.

In step 110, the alignment of the captured data to the correct number of device cycles is determined from the phase of the clock.

Although the present invention has been described in detail with reference to particular embodiments, persons possessing ordinary skill in the art to which this invention pertains will appreciate that various modifications and enhancements may be made without departing from the spirit and scope of the claims that follow.

I claim:

1. A method for asynchronous digital capture comprising:
    concurrently capturing a digital output of a device under test (DUT) clock on an automated test equipment (ATE) digital channel and capturing NRZ output data of the DUT on adjacent ATE channels;
    analyzing the digital clock data such that a frequency spectrum is generated;
    determining a frequency and phase of the clock from the spectrum;
    determining a number of device cycles captured from the clock frequency; and
    determining an alignment of the captured NRZ output data to the number of device cycles from the phase of the clock.

2. A method, as defined in claim 1, the step of analyzing including:
    multiplying the digital clock data by a digital signal processing (DSP) window; and
    performing a fast Fourier transform on the multiplied data.

3. A method, as defined in claim 2, wherein the digital signal processing window is selected from a group that includes Hanning and Hamming windows.

4. A method, as defined in claim 1, the step of analyzing including:
    multiplying the digital clock data by a digital signal processing (DSP) window; and
    performing a discrete Fourier transform on the multiplied data.

5. A method, as defined in claim 4, wherein the digital signal processing window is selected from a group that includes Hanning and Hamming windows.

* * * * *

UNITED STATES PATENT AND TRADEMARK OFFICE
CERTIFICATE OF CORRECTION

PATENT NO. : 7,587,015 B2  Page 1 of 1
APPLICATION NO. : 11/355599
DATED : September 8, 2009
INVENTOR(S) : Kevin Slaboda It is certified that error appears in the above-identified patent and that said Letters Patent is hereby corrected as shown below:

Column 1, line 50, "he" should read --the--.

Signed and Sealed this

Tenth Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,587,015 B2
APPLICATION NO. : 11/355599
DATED : September 8, 2009
INVENTOR(S) : Kevin Slaboda It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 786 days.

Signed and Sealed this

Fourteenth Day of December, 2010

David J. Kappos
*Director of the United States Patent and Trademark Office*